United States Patent [19]
Sih et al.

[11] Patent Number: 5,546,459
[45] Date of Patent: Aug. 13, 1996

[54] VARIABLE BLOCK SIZE ADAPTATION ALGORITHM FOR NOISE-ROBUST ACOUSTIC ECHO CANCELLATION

[75] Inventors: Gilbert C. Sih, San Diego; Franklin P. Antonio, Del Mar, both of Calif.

[73] Assignee: Qualcomm Incorporated, San Diego, Calif.

[21] Appl. No.: 146,644

[22] Filed: Nov. 1, 1993

[51] Int. Cl.$^6$ .................................................. H04M 9/08
[52] U.S. Cl. .......................... 379/411; 379/410; 379/406; 379/416; 370/32.1
[58] Field of Search ........................ 379/410, 411, 379/406, 416; 370/32.1; 375/99, 121

[56] References Cited

U.S. PATENT DOCUMENTS

| | | | |
|---|---|---|---|
| 4,712,235 | 12/1987 | Jones, Jr. | 379/410 |
| 4,947,425 | 8/1990 | Grizmala et al. | 379/410 |
| 4,987,569 | 1/1991 | Ling et al. | 379/410 |
| 5,084,866 | 1/1992 | Buttle | 370/32.1 |
| 5,109,533 | 4/1992 | Minc et al. | 455/63 |
| 5,111,481 | 5/1992 | Chen et al. | 375/99 X |
| 5,297,186 | 5/1994 | Dang | 375/121 |
| 5,337,366 | 8/1994 | Eguchi et al. | 381/71 |
| 5,351,291 | 9/1994 | Menez et al. | 379/411 |
| 5,410,595 | 4/1995 | Park et al. | 379/410 |

OTHER PUBLICATIONS

IEEE article "The Block–Processing FTF Adaptive Algorithm" by John M. Cioffi published Feb. 1986, pp. 77–90.
International Search Report Dated Feb. 17, 1995.

Hsieh et al., "Performance Analysis of Time Domain Block LMS Algorithms," ICASSP-93, 27–30 Apr. 1993 pp. 535–8 vol. 3 of 5.

Lee et al., "Efficient Zero–Phase Constrained Frequency––Domain Block LMS Adaptive Algorithm," Electronics Letters 12 May 1988 vol. 24 #10 pp. 602–603.

Ohmuro et al., "An Adaptive Digital Filter as a sinuoidal noise canceler" IEE of Japan vol. 564–A No. 9, Sep. 1981, pp. 767–774.

*Primary Examiner*—Jeffery Hofsass
*Assistant Examiner*—Daniel S. Hunter
*Attorney, Agent, or Firm*—Russell B. Miller; Sean English

[57] ABSTRACT

An apparatus that automatically adjusts the adaptation block size for a least-mean square (LMS) adaptive filter depending on the input signal-to-noise ratio (SNR) is disclosed. The apparatus monitors the instantaneous SNR and continually adjusts the block size to provide high noise immunity, thereby increasing the convergence speed of the filter and decreasing the asymptotic mean-square error. An exemplary embodiment of the present invention is presented in the context of acoustic echo cancellation, though it is noted that the adaptive filter of the present invention is useful in any environment in which the noise characteristics are subject to change.

23 Claims, 1 Drawing Sheet

VARIABLE BLOCK SIZE ADAPTATION ALGORITHM FOR NOISE-ROBUST ACOUSTIC ECHO CANCELLATION

BACKGROUND OF THE INVENTION

I. Field of the Invention

The present invention relates to communication systems. More particularly, the present invention relates to a novel and improved adaptive filter wherein the number of consecutive samples over which an averaging procedure is performed to adjust the tap values of the adaptive filter varies in accordance with the noise content of the channel upon which the adaptive filter operates.

II. Description of the Related Art

Acoustic echo cancellers (AEC) are used in teleconferencing and hands-free telephony applications to eliminate acoustic feedback between a loudspeaker and a microphone. In a mobile telephone system where a vehicle occupant uses a hands-free telephone, acoustic echo cancellers are used in the mobile station to provide full-duplex communications.

For reference purposes, the driver is the near-end talker and the person at the other end of the connection is the far-end talker. The speech of the far-end talker is broadcast out of a loudspeaker in the mobile. If this speech is picked up by a microphone, the far-end talker hears an annoying echo of his or her own voice. An acoustic echo canceller identifies the unknown echo channel between the loudspeaker and microphone using an adaptive filter, generates a replica of the echo, and subtracts it from the microphone input to cancel the far-end talker echo.

A block diagram of a traditional acoustic echo canceller is shown below in FIG. 1, where the echo path has been shown using dashed lines. The far-end speech x(n) is broadcast out as loudspeaker output and passes through the unknown echo channel 6, which is illustrated as an element though its existence is simply an artifact of the near-end microphone's colocation with the near-end loudspeaker, to produce the echo signal y(n). The near-end microphone input receives the sum of the echo signal y(n), channel noise w(n) and near-end speech v(n), the summations of which are shown by means of summing elements 8 and 10, which are purely for illustrative purposes. The near-end received signal r(n) is a sum of the echo signal y(n), channel noise w(n) and near-end speech v(n).

When the far-end talker is the only one speaking, the filter coefficients represented by vector $\vec{h}(n)$ are adapted to track the impulse response of the unknown echo channel. Adaptation control element 2 receives the error or residual signal e(n) and the far-end speech x(n) and in response provides a tap correction signal to adaptive filter 4. The adaptive filter 4 receives the tap correction signal and corrects its filter tap values in accordance with the tap correction signal. In accordance with the adapted filter coefficients $\vec{h}(n)$ and the far-end speech signal x(n), adaptive filter 4 generates a replica of the echo, $\hat{y}(n)$ which is provided to subtraction element 12. Subtraction element 12 subtracts the estimated echo $\hat{y}(n)$ from near-end received signal r(n).

Typically, the algorithm used to update the filter tap coefficients that track the echo path response is the least-mean-square (LMS) adaptation algorithm. The filter order is denoted as N and the far-end speech vector $\vec{x}(n)$ is represented as:

$$\vec{x}(n)=[x(n)x(n-1)x(n-2)\ldots x(n-N+1)], \quad (1)$$

and the filter-tap coefficient vector is represented as:

$$\vec{h}(n)=[h_0(n)h_1(n)h_2(n)\ldots h_{N-1}(n)]. \quad (2)$$

As each new sample r(n) is received, the algorithm computes the echo estimate $\hat{y}(n)$ based on its current filter taps:

$$\hat{y}(n) = \langle \vec{h}(n)\vec{x}(n)\rangle = \sum_{i=0}^{N-1} h_i(n)x(n-i). \quad (3)$$

This estimated echo signal $\hat{y}(n)$ is subtracted from the near-end received signal r(n), so that the echo residual is given by:

$$e(n)=r(n)-\hat{y}(n). \quad (4)$$

The adaptation algorithm is disabled when the near-end talker is speaking, so that the tap coefficient vector is then updated as:

$$\vec{h}(n+1)=\vec{h}(n)+\alpha e(n)\vec{x}(n) \quad (5)$$

where $\alpha$ is the adaptation step size and the error signal in the absence of near-end speech v(n) and noise w(n) is given by:

$$e(n)=y(n)-\hat{y}(n) \quad (6)$$

The LMS algorithm derives its name from the fact that it attempts to minimize the mean of the squared error:

$$MSE(n)=E[e^2(n)]. \quad (7)$$

The LMS algorithm is also called the "stochastic gradient" method because an approximation to the gradient of MSE(n) with respect to the tap vector is given by:

$$\frac{\partial MSE(n)}{\partial \vec{h}(n)} \approx -2e(n)\vec{x}(n). \quad (8)$$

Since the gradient indicates the direction that the mean square error increases most rapidly, each tap update is steered in the opposite direction of the gradient by adapting the tap values in relation to the inverted gradient.

The main advantages of the LMS algorithm are that it requires less computation than other adaptive methods and its stability can be guaranteed by proper choice of step size. This algorithm executes on a sample-by-sample basis; that is, the tap vector $\vec{h}(n)$ is updated with each new sample.

An alternative implementation, called the block LMS algorithm, updates the tap vector using a block of L samples. As before, as each new sample r(n) is received, the algorithm computes the echo estimate $\hat{y}(n)$ and the echo residual signal e(n). However, instead of immediately updating the filter coefficients, the algorithm averages L consecutive instances of the negative gradient $e(n)\vec{x}(n)$ (the "2" in the gradient expression has been absorbed into the step size $\alpha$) and updates the coefficient vector $\vec{h}(n)$ once per L-sample block. The block LMS algorithm can therefore be expressed as:

$$\vec{h}((n+1)L) = \vec{h}(nL) + \frac{\alpha}{L} \sum_{j=0}^{L-1} e(nL+j)\vec{x}(nL+j). \quad (9)$$

Notice that if L=1, this equation reduces to the sample LMS presented in equation 5, so the sample LMS algorithm can be considered to be a degenerate case of the block LMS algorithm. The advantage of choosing a block size L greater than 1 is realized when noise is present. As shown in FIG. 1, any noise w(n) present in the echo channel is added to the echo signal y(n) and therefore appears in the error signal:

$$e(n)=y(n)+w(n)-\hat{y}(n). \quad (10)$$

Therefore, the direction of each sample gradient is perturbed by the noise, which causes the sample (L=1) LMS algorithm to have a longer convergence time and a larger asymptotic mean square error. However, by choosing L>1, we average L consecutive instances of the gradient to achieve a more accurate estimate because the positive and negative noise samples will tend to cancel each other out during the averaging process.

SUMMARY OF THE INVENTION

The present invention is a novel and improved adaptive filter that is more robust to environments that have varying noise energies. An exemplary implementation of the present invention is presented in an exemplary embodiment of an acoustic echo canceller.

When the noise w(n) is small compared to the size of the echo, the sample LMS (L=1) converges more rapidly than the block LMS (L>1) algorithm for the same step size α. As the noise increases in amplitude, the optimum block size L', for maximum convergence speed, also increases.

In the present invention, a method and apparatus are presented that adjust the block size L responsive to the noise content on the channel. In a preferred embodiment the block size L is adjusted in response to the instantaneous signal-to-noise ratio (SNR). In the exemplary implementation of the present invention, an echo canceller is disclosed that comprises an adaptive filter the taps of which are adapted in accordance with the variable block size LMS method of the present invention.

In the exemplary embodiment of an echo canceller, an adaptive filter generates an estimated echo signal $\hat{y}(n)$, which is subtracted from the near-end received signal r(n) to provide a residual signal e(n). The noise composition of the channel is monitored, and in accordance with the noise composition of the channel an adaptation block size L is selected. The adaptive filter tap values are then corrected or adapted in accordance with the far-end speech x(n), the residual signal e(n) and the adaptation block size L as shown in equation 9.

Although the exemplary implementation of the present invention takes the form of acoustic echo cancellation, it is envisioned that the scope of the present invention extends to use in any environment in which adaptive filters are employed and the channel noise characteristics are subject to change.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 1:
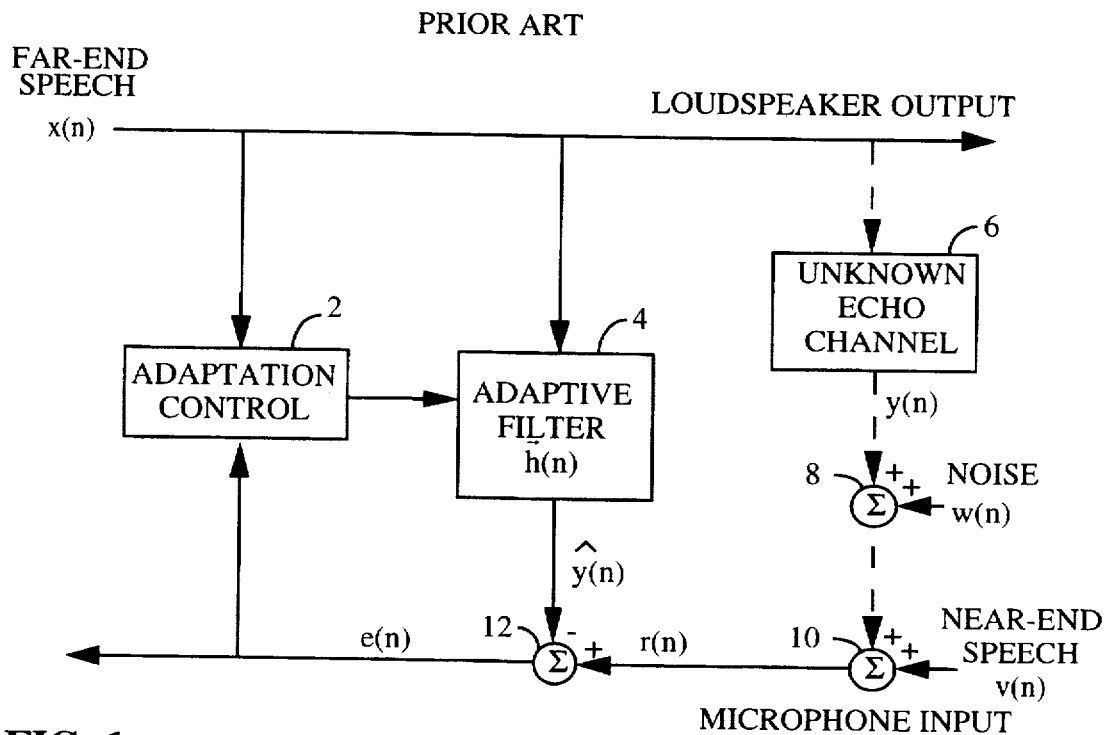
FIG. 1 is a block diagram of an echo canceller employing a traditional fixed block size LMS algorithm.

In the present invention, a method and apparatus are presented that adjust the block size L responsive to the noise content on the channel. In a preferred embodiment the block size L is adjusted in response to the instantaneous signal-to-noise ratio (SNR). Ideally, the signal being referred to in the instantaneous SNR is the echo signal, such that the signal-to-noise ratio at time n, SNR(n), is computed as:

$$SNR(n)\ (dB)=10\log_{10}[E_y(n)/E_w(n)], \quad (11)$$

where $E_y(n)$ is the energy of the echo signal at time n and $E_w(n)$ is the energy of the noise signal at time n.

However, since the actual value of y(n) is unknown at the filter, the echo signal energy Ey(n) can be approximated as:

$$\hat{E}y(n) = \sum_{i=0}^{N} |r(n-i)|^2 \quad (12)$$

during periods where the far-end talker is the only one talking. Similarly, since the noise signal w(n) is unknown at the filter the noise energy Ew(n) can be computed as:

$$\hat{E}w(n) = \sum_{i=0}^{N} |r(n-i)|^2 \quad (13)$$

when both the far-end and near-end talkers are silent. Using the approximations in equations 10 and 11, an approximation of the signal to noise SNR(n) ratio of equation 11 can be computed as:

$$S\hat{N}R(n)=10\log_{10}|\hat{E}y(n)/\hat{E}w(n)| \quad (14)$$

Figure 2:
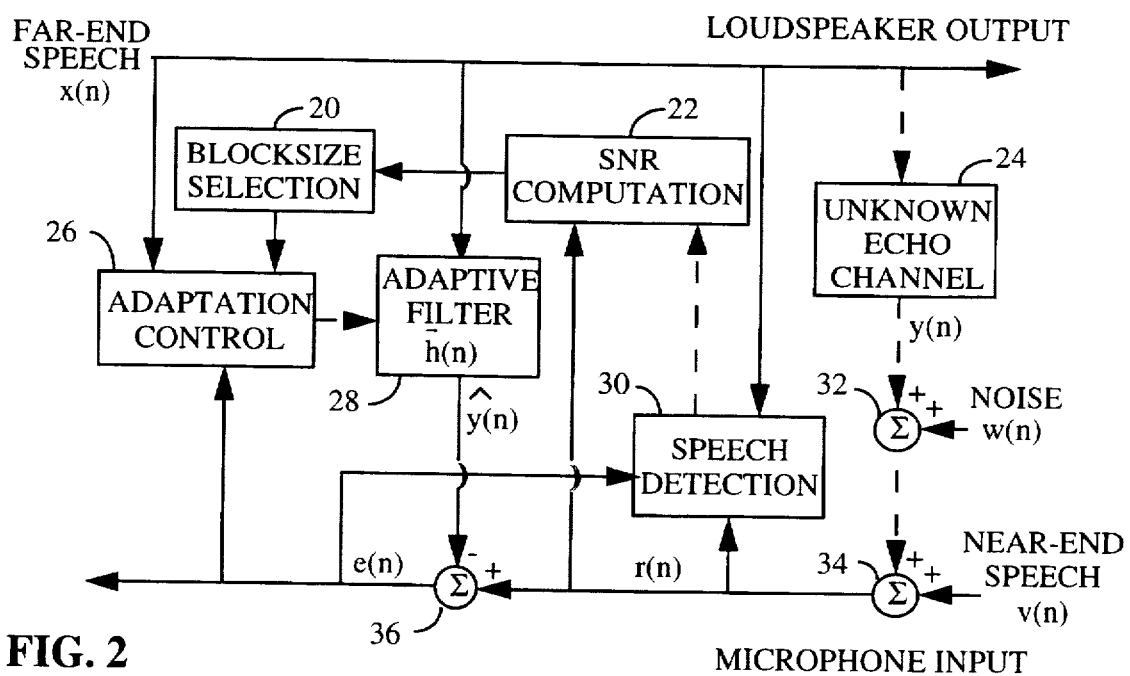
FIG. 2 is a block diagram of an exemplary implementation of the present invention of a variable block size LMS algorithm within an acoustic echo canceller.

Referring now to FIG. 2, speech detection element 30 monitors the energy of signals x(n), r(n), and e(n) to determine when the far-end talker is the only one talking and when neither talker is speaking. Speech detection element 30 provides control signals to the SNR computation element 22. SNR computation element 22 also receives the near-end received signal r(n) and computes $\hat{E}y(n)$, $\hat{E}w(n)$, and $S\hat{N}R(n)$ as given above, responsive to the control signals from speech detection element 30. SNR computation element 22 provides $S\hat{N}R(n)$ to block size selection element 20, which selects the adaptation block size L in accordance with $S\hat{N}R(n)$. Block size selection element 20 provides the adaptation block size L to adaptation control element 26.

Adaptation control element 26 receives far-end speech x(n) and error signal e(n), in addition to the adaptation block size L and in accordance with these input signals determines filter tap correction values $\vec{c}(nL)$ as follows:

$$\vec{c}(nL) = \frac{\alpha}{L} \sum_{j=0}^{L-1} e(nL+j)\vec{x}(nL+j). \quad (15)$$

The filter tap correction values $\vec{c}(nL)$ are provided to adaptive filter 28 by adaptation control 26. In response to the filter tap correction values $\vec{c}(nL)$, adaptive filter 28 generates corrected filter tap values $\vec{h}((n+1)L)$ as:

$$\vec{h}((n+1)L)=\vec{h}(nL)+\vec{c}(nL). \quad (16)$$

Adaptive filter 28, also, receives far-end speech signal x(n), and generates an estimate of the echo signal $\hat{y}(n)$ in accordance with the corrected filter tap values $\vec{h}((n+1)L)$ and the far-end speech signal x(n). The estimated echo signal $\hat{y}(n)$ is then subtracted from the near-end received signal r(n) by subtraction element 36.

In the exemplary embodiment the present invention has been described in the context of an acoustic echo canceller. This is a particularly useful application of the present invention since the noise in a car continually changes owing to many factors, such as vehicle speed, smoothness of the road, weather conditions, varying external noise, and whether the car windows are up or down. For example, the driver may initiate a call while sitting in a quiet parked car where the apparatus of the present invention would set L equal to 1 for fastest convergence. When the driver starts the car and revs the engine, the machine would detect the drop in SNR and automatically increase L, to say 32. While driving through a quiet residential area, the apparatus of the present invention may decrease L to 16, and upon entering a bumpy freeway, the apparatus of the present invention may again increase L to 64. This automatic block size selection for fastest convergence is important, because the adaptive filter must be continually updated to account for changes in the acoustic channel between the loudspeaker and the microphone.

An alternative embodiment of the present invention comprises a plurality of adaptive filters each of which employs a different averaging length for adapting the filter coefficients. An output source is then dynamically selected from the outputs of the bank of adaptive filters. In yet another alternative embodiment, instead of varying the block sizes directly, temporally staggerred blocks of one size may be used.

Although in the exemplary embodiment of the present invention is presented in the environment of an acoustic echo canceller, it is applicable in any environment in which adaptive filters are employed and the channel noise characteristics are subject to change, such as network echo cancellation and channel equalization.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

We claim:

1. An adaptive filter in a communications channel comprising:

noise computation means for monitoring noise content in the communications channel and for providing a monitor signal indicative of the noise content in the channel;

block size selection means for determining a variable adaptation block size value in response to said monitor signal;

filter coefficient computation means for receiving said variable adaptation block size value and for determining at least one filter tap correction value in response to said variable adaptation block size value; and filter means for receiving at said least one filter tap correction value and for filtering a signal present in communications channel in accordance with said at least one filter tap correction value.

2. The apparatus of claim 1 wherein, said noise computation means monitors the signal to noise ratio in the communications channel and said monitor signal is indicative of the signal to noise ratio in the communications channel.

3. An echo canceller for canceling an echo signal of a far-end speech signal in a near-end speech signal in a communications channel, comprising:

block size selection means for determining a variable adaptation block size value;

filter coefficient computation means for receiving said variable adaptation block size value and for determining at least one filter tap correction value in response to said variable adaptation block size value;

filter means for receiving said at least one filter tap correction value and said far-end speech signal and for providing an estimate of said echo signal in accordance with said far-end speech signal and said at least one filter tap correction value; and difference means for subtracting said estimate of said echo signal from said near-end speech signal to provide a filtered near-end speech signal.

4. The apparatus of claim 3 further comprising noise computation means for monitoring noise content in the communications channel and for providing a monitor signal indicative of the noise content in the communications channel; and wherein said block size selection means is responsive to said monitor signal.

5. The apparatus of claim 4 wherein, said noise computation means monitors the signal to noise ratio in the communications channel and said monitor signal is indicative of the signal to noise ratio in the communications channel.

6. The apparatus of claim 4 further comprising speech detection means for detecting said far-end speech signal and said near-end speech signal and for providing a control signal responsive to the presence of said far-end speech signal and said near-end speech signal; and wherein said noise computation means is responsive to said control signal.

7. The apparatus of claim 6 wherein, said noise computation means monitors the signal to noise ratio in the communications channel and said monitor signal is indicative of the signal to noise ratio in the communications channel.

8. A method for adaptively filtering a signal present in a communications channel comprising the steps of:

monitoring noise content in the communications channel and providing a monitor signal indicative of the noise content in the communications channel;

determining a variable adaptation block size value in response to said monitor signal;

determining at least one filter tap correction value in response to said variable adaptation block size value; and filtering the signal present in the communications channel in accordance with said at least one filter tap correction value.

9. The apparatus of claim 8 wherein, said step of monitoring noise content in the communications channel comprises monitoring the signal to noise ratio in the communications channel; and wherein said monitor signal is indicative of the signal to noise ratio in the communications channel.

10. A method for canceling an echo signal of a far-end speech signal in a near-end speech signal in a communications channel, comprising:

determining a variable adaptation block size value;

determining at least one filter tap correction value in response to said variable adaptation block size value;

providing an estimate of said echo signal in accordance with said far-end speech signal and said at least one filter tap correction value; and subtracting said estimate of said echo signal from said near-end speech signal to provide an echo canceled near-end speech signal in the communications channel.

11. The method of claim 10 further comprising the steps of monitoring noise content in the communications channel and providing a monitor signal indicative of the noise content in the communications channel; and wherein said step of determining said variable adaptation block size value determines said variable adaptation block size value in response to said monitor signal.

12. The apparatus of claim 11 wherein, said step of monitoring noise content in the communications channel comprises monitoring the signal to noise ratio in the communications channel; and wherein said monitor signal is indicative of the signal to noise ratio in the communications channel.

13. The method of claim 11 further comprising the step of providing a control signal responsive to the presence of said far-end speech signal and said near-end speech signal; and wherein said step of providing said monitor signal provides said monitor signal in response to said control signal.

14. An adaptive filter for filtering a signal present in a communications channel comprising:

averaging means for receiving the signal in the communications channel and for averaging a variable size block of samples of the signal to provide a sample average, wherein said bock size is varied as a function of noise content in the noise content in the communications channel;

filter coefficient computation means for receiving said sample average and for determining at least one filter tap correction value in response to said sample average; and filter means for receiving said at least one filter tap correction value and for filtering the signal present in the communications channel in accordance with said at least one filter tap correction value.

15. The apparatus of claim 14 wherein, said noise content comprises signal to noise ratio.

16. A method for filtering a signal present in a communications channel comprising the steps of:

receiving the signal;

averaging a variable size block of samples of the signal to provide a sample average, wherein said block size is varied as a function of noise content in the communications channel;

determining at least one filter tap correction value responsive to said sample average; and filtering the signal present in the communications channel in accordance with said at least one filter tap correction value.

17. The apparatus of claim 16 wherein, said noise content comprises signal to noise ratio.

18. An adaptive filter in a communications channel comprising:

a noise monitor coupled to the communications channel and having an output for providing a monitor signal indicative of noise content in the communications channel;

a block size selector having an output for providing a variable adaptation block size value in response to said monitor signal;

a filter coefficient calculator having an input coupled to said output of said block size selector and having an output for providing at least one filter tap correction value in response to said variable adaptation block size value; and a filter in the communications channel having an input coupled to said output of said filter coefficient calculator and having a second input for receiving an input signal from the communications channel and an output for providing a filtered input signal.

19. The apparatus of claim 18 wherein, said noise content comprises signal to noise ratio.

20. An echo canceller for canceling an echo signal of a far-end speech signal in a near-end speech signal in a communications channel, comprising:

a noise monitor coupled to the communications channel and having an output for providing a monitor signal indicative of the noise content in the communications channel;

a block size selector having an output for providing a variable adaptation block size value, wherein said block size selector has an input coupled to said output of said signal to noise ratio monitor;

a filter coefficient calculator having an input coupled to said output of said block size selector and having an output;

a filter having an input coupled to said output of said filter coefficient calculator and having an output for providing an echo signal estimate in accordance with the far-end speech signal; and a subtractor having a first input coupled to said output of said filter and having a second input for receiving said near-end speech signal, said subtractor subtracting said echo signal estimate from said near-end speech signal to produce an echo-canceled near-end speech signal.

21. The apparatus of claim 20 wherein, said noise content comprises signal to noise ratio.

22. The apparatus of claim 20 further comprising a speech detector having a first input for receiving said far-end speech signal and a second input for receiving said near-end speech signal and having an output for providing a control signal responsive to the presence of said far-end speech signal and said near-end speech signal; and wherein said noise monitor has a second input coupled to said output of said speech detector.

23. The apparatus of claim 22 wherein, said noise content comprises signal to noise ratio.

* * * * *